US006977390B2

(12) United States Patent
Andriessen

(10) Patent No.: US 6,977,390 B2
(45) Date of Patent: Dec. 20, 2005

(54) LAYER CONFIGURATION COMPRISING AN ELECTRON-BLOCKING ELEMENT

(75) Inventor: Hieronymus Andriessen, Beerse (BE)

(73) Assignee: Agfa Gevaert, Mortsel (BE)

( * ) Notice: Subject to any disclaimer, the term of this patent is extended or adjusted under 35 U.S.C. 154(b) by 112 days.

(21) Appl. No.: 10/641,381

(22) Filed: Aug. 14, 2003

(65) Prior Publication Data

US 2004/0036067 A1 Feb. 26, 2004

Related U.S. Application Data

(60) Provisional application No. 60/409,793, filed on Sep. 11, 2002.

(30) Foreign Application Priority Data

Aug. 23, 2002 (EP) .......................................... 02102215

(51) Int. Cl.[7] ............................................. H01L 35/24
(52) U.S. Cl. ........................................ 257/40; 438/99
(58) Field of Search ............................. 257/40; 438/99

(56) References Cited

U.S. PATENT DOCUMENTS

| | | | | |
|---|---|---|---|---|
| 4,175,982 A | | 11/1979 | Loutfy et al. | |
| 4,273,842 A | * | 6/1981 | Nonogaki et al. | 430/25 |
| 5,995,273 A | | 11/1999 | Chandrasekhar | |
| 6,206,937 B1 | | 3/2001 | Kudoh et al. | |
| 6,503,643 B1 | * | 1/2003 | Heuer et al. | 428/690 |

FOREIGN PATENT DOCUMENTS

| | | |
|---|---|---|
| DE | 198 39 948 A1 | 3/2000 |
| EP | 0 728 745 A1 | 8/1996 |
| EP | 1 122 274 A1 | 8/2001 |
| EP | 1 231 251 A1 | 8/2002 |
| JP | 04 085389 A | 3/1992 |
| JP | 04 198389 A | 7/1992 |
| JP | 04 293972 A | 10/1992 |
| WO | WO 00/6665 A1 | 2/2000 |
| WO | WO 00/65653 A1 | 11/2000 |
| WO | WO 01/78464 A1 | 10/2001 |

OTHER PUBLICATIONS

Lee et al.; *Advanced Materials*, vol. 13 (16), 1274–1278, (Aug. 2001).

Lee et al; *J. of Applied Physics*, vol. 90 (5), 2128–2134 (Sep. 2001).

Search Report for EP 02 10 2215 (Jan. 27, 2003).

Search Report for PCT/EP2003/050343 (Jan. 13, 2004).

* cited by examiner

*Primary Examiner*—Long Pham
*Assistant Examiner*—Wai-Sing Louie
(74) *Attorney, Agent, or Firm*—Leydig, Voit & Mayer, Ltd.

(57) ABSTRACT

A layer configuration on a support, the layer configuration comprising a non-photoactive element exclusive of poly(3,4-alkylenedioxythiophene)s, poly(3,4-dialkoxythiophene)s, polyanilines and polypyrroles, said element containing at least one polymer selected from the group consisting of polysulphato-polymers and polysulpho-polymers, the surface of one side of the element being contiguous with a positive electrode and the surface on the opposite side of the element being contiguous with a material capable of transporting holes.

17 Claims, 1 Drawing Sheet

LAYER CONFIGURATION COMPRISING AN ELECTRON-BLOCKING ELEMENT

Figure 1:
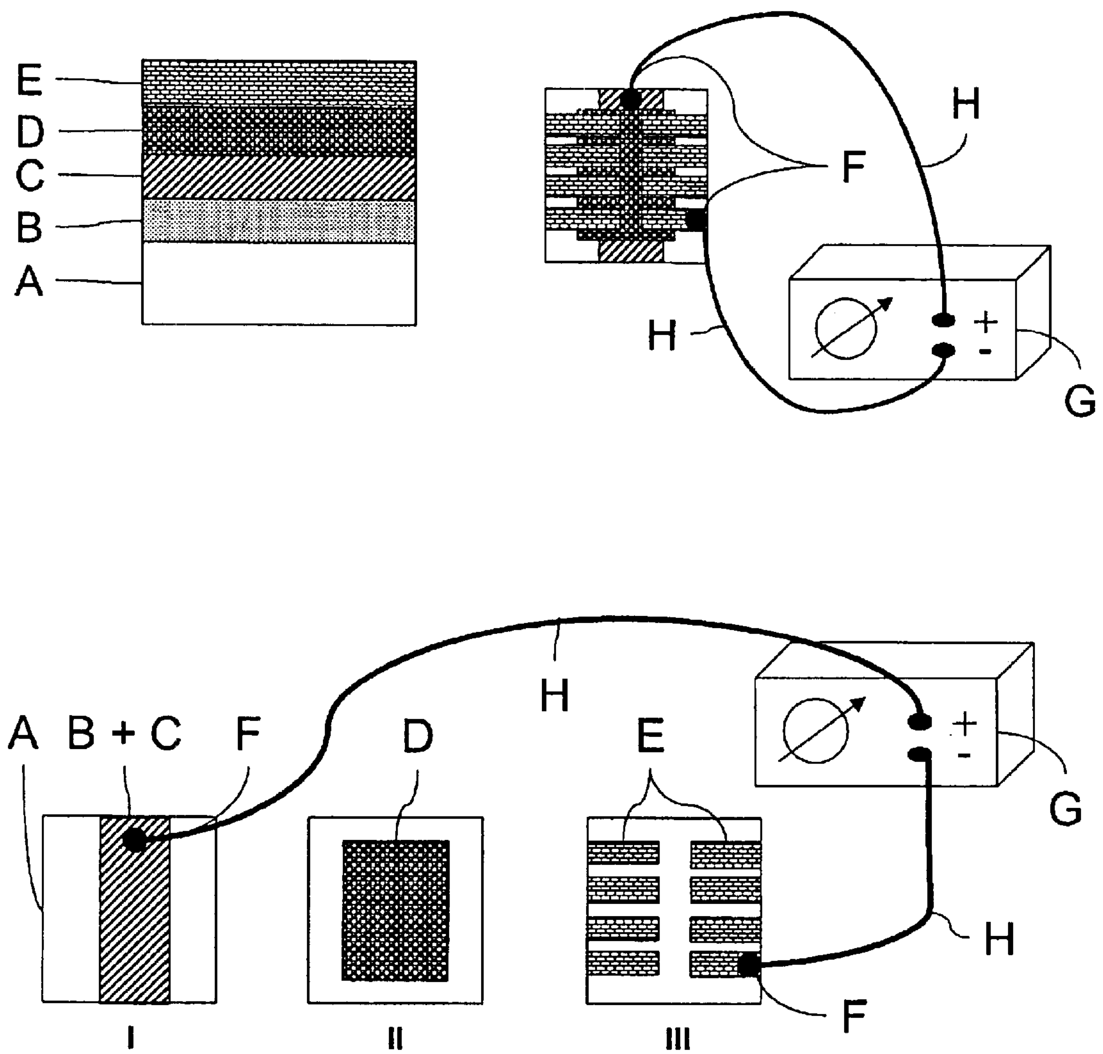

This application claims the benefit of U.S. Provisional Application No. 60/409,793 filed Sep. 11, 2002, which is incorporated by reference. In addition, this application claims the benefit of European Application No. 02102215.7 filed Aug. 23, 2002, which is also incorporated by reference.

FIELD OF THE INVENTION

The present invention relates to a layer configuration comprising an electron-blocking element.

BACKGROUND OF THE INVENTION

WO 00/65653 discloses a method in the fabrication of an organic thin-film semiconducting device, wherein the semiconducting device comprises an electrode arrangement with electrodes contacting a semiconducting organic material, and wherein the method is characterized by depositing a first layer of a conducting or semiconducting material in the form of a combination of a conducting and a semiconducting material in the form of a patterned or non-patterned layer on an insulating substrate, such that at least a portion of the substrate is covered by the first layer; modifying the work function of the conducting layer and/or semiconducting material of the first layer by depositing a second layer of a conducting polymer with a work function higher than that of the material in the first layer such that the layer of the conducting polymer mainly covers the first layer or is conformal with the latter, whereby the combination of the first layer and the second layer constitutes the anode of the electrode arrangement and the work function of the anode becomes substantially equal to that of the conducting polymer, depositing a third layer of a semiconducting organic material on the top of the anode, and optionally and in casse only a portion of the substrate is covered by the anode, also above at least some of the portion of the substrate not covered by the anode; and depositing a paterned or non-patterned fourth layer of a meatl on the top of the third layer, whereby the fourth layer constitutes the cathode of the electrode arrangement. WO 00/65653 discloses that the conducting polymer in the second layer is a doped conjugated polymer e.g. poly(3,4-dioxyethylenethiophene) (PEDOT), a copolymer which includes the monomer 3,4-dioxyethylene thiophene, substituted poly(thiophenes), substituted poly(thiophenes), substituted poly(pyrroles), substituted poly(anilines) or copolymers thereof, with the dopant being preferably poly(4-styrene sulphonate) (PSS).

EP-A 1 122 274 discloses a process for preparing water-soluble π-conjugated polymers, characterized in that the monomer thiophene derivative according to formula (I)

(I)

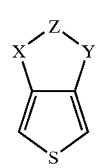

in which X and Y are independently O,S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-$ $M^+$; $R^3$ is —$(CH_2)_s$—O—$(CH_2)_p$—$SO_3^{-M+}$; $M^+$ is a cation; m and n are independently a whole number from 0 to 3; s is a whole number from 0 to 10; and p is a whole number from 1 to 18; is polymerized by an oxidation agent in aqueous solution.

WO 00/06665 discloses an electroluminescent device comprising a light-emitting organic film, arranged between an anode material and a cathide material such that under an applied voltage, the device is forward biased and holes are injected from the anode material into the organic film adjacent to the anode material and electrons are injected from the cathode material into the organic film adjacent to the cathode material, resulting in light emission from the light-emitting organic film; wherein the device additionally comprises a solution-processed film of a blend of an acid-functional non-conductive polymer e.g. polymers having pendant groups selected from sulfonic acid, sulfinic acid, carboxylic acid, phosphoric acid, phosphonic acid, phosphinic acid, and —N+$(R)^2$H where R is selected from hydrogen, $C_1$–$C_{20}$ hydrocarbyl, hydroxy, alkoxy, and aryloxy, and a conductive polymer positioned between the anode material and the light-emitting organic film, wherein the weight ratio of non-conducting to conducting polymer is at least 0.75:1. WO 00/0665 specifically discloses the following non-conductive polymers: sulfonated polyphenylenes, polyphenylenes bearing carboxylic acid functional groups, poly(styrene sulfonic acid), poly(2-acrylamido-2-methyl-1-propanesulfonic acid), polyacrylic acid, polymethacrylic acid or a mixture thereof.

WO 01/78464 discloses in an organic/polymer electroluminescent (EL) device which comprises: a transparent substrate; a semitransparent electrode deposited on the transparent substrate; a hole-injecting layer positioned on the semitransparent electrode; an emissive layer made of an organic EL-material, positioned on the hole-injecting layer; and electron-injecting layer positioned on the electron-injecting layer, the improvement comprising that single-ion conductors are employed for the hole-injecting layer and the electron-injecting layer. The specification does not define the meaning of the term "single-ion conductor", which in plain language means a conductor of a single ion, although claim 9 teaches that the single ion conductor can be a single-cation conductor or a single anion conductor and claim 10 teaches that such single ion conductors can be represented as a general formula (I) or (II), comprising ether chain [(—$CH_2)_n$O—] such as polyethylene oxide or polypropylene oxide in the main chain, and contains anions such as $SO_3^-$, $COO^-$ or $I^-$ in the main side chains that form ionic bonds with counter ions such as $Na^+$, $Li^+$, $Zn^{2+}$, $Mg^{2+}$, $Eu^{3+}$, or $(NH_3)_4^+$:

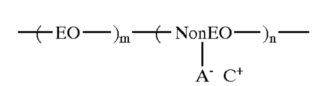

(I)

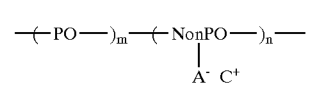

(II)

wherein, EO represents ethylene oxide; Non-EO represents non-ethylene oxide; PO represents propylene oxide; Non-PO represents non-propylene oxide; $A^-$ represents anion; $C^+$ represents cation; m+n=11 and n represents a real number more than 0 and less than 1.

In 2001 T.-W. Lee and O. O. Park disclosed in Advanced Materials, volume 13, pages 1274–1278, polymer light-emitting energy-well devices using single-ion conductors (SIC's) in which charge injection and its confinement simultaneously in EL devices is striven for by using both a single-cationic conductor (SCC) and a single-anionic conductor (SAC), which "greatly improve the charge injection due to accumulation of the mobile ions near the electrodes" with the aim of "confining well-electrons and holes leading to enhanced recombination rate of the pairs" in devices in which "the mobile ions to play a key role in improvement of charge injection are separately located near both electrodes in the structure of a sandwiched multi-layer device instead of blending with the emitting material so that the problem of phase separation of the emitting materials can be avoided". They further disclose that ionic polyurethane possesses good mechanical properties and high ionic conductivity with a single-ion transport character and that SIC's are generally of two different types: one is a polymer blend of an ionomer and polyether which usually possesses poor mechanical properties and the other is the copolymer of an oligomeric ionomer with polyether. They also disclosed that incorporation of the SIC's with soft and hard blocks into the EL devices dramatically improves not only luminance but also the efficiency and that SCC's possess electron-injecting and hole-blocking properties and SAC's possess hole-injecting and electron-blocking properties.

In 2001 T.-W. Lee et al. disclosed in Journal of Applied Physics, volume 90, pages 2128–2134, a study of the effect of ion concentration, neutralization level and counterions in ionomers to obtain the optimal electroluminescent (EL) characteristics in polymer light-emitting diodes using pol[2-methoxy-5-(2'-ethyl-hexyloxy)-1,4-phenylenevinylene] (MEH-PPV) for the emissive layer and sulphonated polystyrene (SPS) ionomers for the electron-injecting layer.

A general problem in electronic devices, particularly in light emitting diodes, is undesirable hole-electron recombination at the positive electrode thereby reducing the efficiency and lifetime of the device.

ASPECTS OF THE INVENTION

It is therefore an aspect of the present invention to provide an element between a positive electrode and a material capable of hole transport, which is capable of reducing hole-electron recombination at the positive electrode thereby increasing the efficiency and lifetime of electronic devices containing such layer configurations.

Further aspects and advantages of the invention will become apparent from the description hereinafter.

SUMMARY OF THE INVENTION

It has been surprisingly found that the use of an element containing an organic polymer containing covalently bonded sulphonic acid groups, sulphate groups, carboxy groups, optionally quaternized amine groups or phosphonic acid groups between a positive electrode and a material capable of hole transport improves the device performance by increasing the lifetime.

Aspects of the present invention are realized by a layer configuration on a support, the layer configuration comprising a non-photoactive element exclusive of poly(3,4-alkylenedioxy-thiophene)s, poly(3,4-dialkoxythiophene)s, polyanilines and polypyrroles, the element at least one polymer selected from the group consisting of polysulphato-polymers and polysulpho-polymers, the surface of one side of the element being contiguous with a positive electrode and the surface on the opposite side of the element being contiguous with a material capable of transporting holes.

Preferred embodiments are disclosed in the dependent claims.

DETAILED DESCRIPTION OF THE INVENTION

FIG. 1 is a schematic representation of a side view and a top view of the layer configuration used in devices 2 to 5 and 7 to 20 and the circuit used for obtaining electroluminescence in which:

| | |
|---|---|
| A | represents a poly(ethylene terephthalate) support; |
| B | represents an sputtered ITO layer; |
| C | represents an electron blocking layer; |
| D | represents an electroluminescent layer containing ZnS:Cu nano-particles and a binder; |
| E | represents an evaporated aluminium electrode |
| F | represents conductive silver paste dots for contacting |
| G | represents IV-power source (Power Supply ES 030-5 of Delta Elektronica) |
| H | represents electric conductive copper wires |
| I | indicates the first layer |
| II | indicates the second layer |
| III | indicates the third layer |

DEFINITIONS

The term alkyl means all variants possible for each number of carbon atoms in the alkyl group i.e. for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethylpropyl and 2-methyl-butyl etc.

The term aqueous for the purposes of the present invention means containing at least 60% by volume of water, preferably at least 80% by volume of water, and optionally containing water-miscible organic solvents such as alcohols e.g. methanol, ethanol, 2-propanol, butanol, iso-amyl alcohol, octanol, cetyl alcohol etc.; glycols e.g. ethylene glycol; glycerine; N-methylpyrrolidone; methoxypropanol; and ketones e.g. 2-propanone and 2-butanone etc.

The term element as used in disclosing the present invention means a single layer containing one or more polymers selected from the group consisting of polysulphato-polymers and polysulpho-polymers or two contiguous layers wherein the innermost layer of the element with respect to the support contains at least one polymer selected from the group consisting of polysulphato-polymers and polysulpho-polymers and the outermost layer with respect to the support contains at least one polymer selected from the group consisting of polysulphato-polymers and polysulpho-polymers, which is different from the polymers selected from the group consisting of polysulphato-polymers and polysulpho-polymers in the innermost layer with respect to the support.

The term "non-photoactive element" as used in disclosing the present invention means an element which is not photoactive, where photoactive means either capable of reacting to light or capable of emitting light.

The term poly(3,4-alkylenedioxythiophene) as used in disclosing the present invention means a polythiophene in which the 3 and 4 positions in the thiophene ring are linked by a —O-alkylene-O— group, where the term alkylene means a saturated hydrocarbon group containing the carbon atoms linking the two oxygen atoms in the —O-alkylene-O— group and also saturated hydrocarbon groups containing the carbon atoms linking the two oxygen atoms in the —O-alkylene-O— group in which these carbon atoms are covalently linked with one or more alkyl groups e.g. poly(3,4-ethylenedioxythiophene), poly[3,4-(1,2-propylene)dioxythiophene] and poly[3,4-(1,3-propylene)dioxythiophene].

The term polysulfato-polymer as used in disclosing the present invention means a polymer with more than one hydrogen sulfate group.

The term polysulfo-polymer as used in disclosing the present invention means a polymer with more than one sulphonic acid groups.

The term polycarboxy-polymer as used in disclosing the present invention means a polymer with more than one carboxylic acid group.

The term polymer includes homopolymers, copolymers, terpolymers, graft polymers and block copolymers and both chain and condensation polymers.

The passage "material capable of transporting holes" as used in disclosing the present invention means a material into which holes can be injected and through which holes can be transported, such a material preferably having a hole mobility $>10^{-8}$ $cm^2$ $V^{-1}$ $s^{-1}$ and particularly preferably having a hole mobility $>10^{-6}$ $cm^2$ $V^{-1}$ $s^{-1}$ as measured by time of flight techniques or in a field effect transistor.

The term conductive polymer as used in disclosing present invention is a polymer in a state such that it has a specific conductivity of at least $10^{-6}$ S/cm and preferably a specific conductivity of at least $10^{-4}$ S/cm.

The abbreviation PEDOT-S represents poly[4-(2,3-dihydro-thieno[3,4-b][1,4]dioxin-2-ylmethoxy)-butane-1-sulphonic acid].

The abbreviation PSS represents poly(styrene sulphonic acid) or poly(styrenesulphonate).

The abbreviation HTs represents p-toluenesulphonic acid and Ts or tosylate represents p-toluenesulphonate.

Layer Configuration

Aspects of the present invention are realized with a layer configuration on a support, the layer configuration comprising a non-photoactive element exclusive of poly(3,4-alkylenedioxy-thiophene)s, poly(3,4-dialkoxythiophene)s, polyanilines and polypyrroles, the element at least one polymer selected from the group consisting of polysulphato-polymers and polysulpho-polymers, the surface of one side of the element being contiguous with a positive electrode and the surface on the opposite side of the element being contiguous with a material capable of transporting holes.

According to a first embodiment of the layer configuration, according to the present invention, the at least one polymer is a copolymer with a non-carboxy, non-amino, non-sulphato, non-sulpho, non-vinylphosphonic acid containing comonomer.

According to a second embodiment of the layer configuration, according to the present invention, the thickness of the element is between 1 and 20 nm.

According to a third embodiment of the layer configuration, according to the present invention, the at least one polymer is a copolymer with a non-carboxy, non-amino, non-sulphato, non-sulpho, non-vinylphosphonic acid containing comonomer and the thickness of the element is between 1 and 20 nm.

According to a fourth embodiment of the layer configuration, according to the present invention, the element is exclusive of a conductive polymer.

According to a fifth embodiment of the layer configuration, according to the present invention, the layer configuration is a transistor.

The element is preferably prepared by spincoating the coating or coatings from aqueous or solvent media. Solutions or dispersions for spincoating preferably have viscosities of about 2 to 3 cP meaning that up to 95% of the solution is spun off i.e. not deposited during the spincoating process. If the element is prepared by the application of two coatings the first coating is preferably dried in a drying cupboard before the second coating is applied. Depending upon the ingredients and solvents/dispersion media used in the two coatings the two coatings will form a single homogeneous layer after the second coating or two identifiable layers.

Polysulphato-Polymers

Aspects of the present invention are realized by a layer configuration on a support, the layer configuration comprising a non-photoactive element exclusive of poly(3,4-alkylenedioxy-thiophene)s, poly(3,4-dialkoxythiophene)s, polyanilines and polypyrroles, the element containing a polysulphato-polymer, the surface of one side of the element being contiguous with a positive electrode and the surface on the opposite side of the element being contiguous with a material capable of transporting holes.

According to a sixth embodiment of the layer configuration, according to the present invention, the polysulphato-polymer is polyvinylsulphate.

Suitable polysulphato-polymers, according to the present invention, include:

| | |
|---|---|
| POLYSULPHATO-1: | a potassium salt of polyvinylsulphate, cat. no. 27,196–9, from Aldrich; |
| POLYSULPHATO-02: | a 25% by weight aqueous solution of the sodium salt of polyvinylsulphate, cat no. 27,842–4, from Aldrich; |

Polysulpho-Polymers

Aspects of the present invention are realized by a layer configuration on a support, the layer configuration comprising a non-photoactive element exclusive of poly(3,4-alkylenedioxy-thiophene)s, poly(3,4-dialkoxythiophene)s, polyanilines and polypyrroles, the element containing a polysulpho-polymer, the surface of one side of the element being contiguous with a positive electrode and the surface on the opposite side of the element being contiguous with a material capable of transporting holes.

According to a seventh embodiment of the layer configuration, according to the present invention, the polysulpho-polymer contains structural units according to formula (I):

(I)

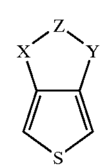

in which X and Y are independently O,S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-M^+$; $R^3$ is —$(CH_2)_s$—O—$(CH_2)_p$—$SO_3^-M^+$; $M^+$ is a cation; m and n are independently a whole number from 0 to 3; s is a whole number from 0 to 10; and p is a whole number from 1 to 18.

According to an eighth embodiment of the layer configuration, according to the present invention, the polysulpho-polymer is a polythiophene according to formula (II)

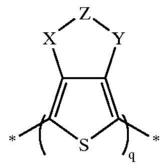

(II)

in which x and Y are independently O, S, N—$R^1$, Z is —$(CH_2)_m$—$CR^2R^3$—$(CH_2)_n$—; $R^1$ is aryl, $C_{1-18}$-alkyl or hydrogen; $R^2$ is hydrogen or —$(CH_2)_s$—O—$(CH_2)_p$—$SO_3^-M^+$; $R^3$ is —$(CH_2)_s$—O—$(CH_2)_p$—$SO_3^-M^+$; $M^+$ is a cation; m and n are independently a whole number from 0 to 3; s is a whole number from 0 to 10; and p is a whole number from 1 to 18; and q is a whole number from 2 to 10,000.

According to a ninth embodiment of the layer configuration, according to the present invention, the polysulpho-polymer is selected from the group consisting of: poly(styrene sulphonic acid), homo- and copolymers of 4-(2,3-dihydro-thieno[3,4-b][1,4]dioxin-2-ylmethoxy)-butane-1-sulphonic acid, polyvinylsulphonic acid, homo and copolymers of N-(1',1'-dimethyl-2'-sulpho-ethyl) acrylamide, and copolymers of ethylene glycol, terephthalic acid and 5-sulpho-isophthalic acid.

According to a tenth embodiment of the layer configuration, according to the present invention, the polysulpho-polymer is poly[4-(2,3-dihydro-thieno[3,4-b][1,4]dioxin-2-ylmethoxy)-butane-1-sulphonic acid].

According to an eleventh embodiment of the layer configuration, according to the present invention, the polysulpho-polymer is a copolymer of N-(1',1'-dimethyl-2'-sulpho-ethyl)-acrylamide or a copolyester with 5-sulpho-isophthalic acid and the thickness of the element is between 1 and 20 nm.

Organic polymer containing structural units according to formula (I) can be polymerized chemically or electrochemically. Chemical polymerization can be carried out oxidatively or reductively. The oxidation agents used for the oxidative polymerisation of pyrrole, such as described for example in Journal of the American Chemical Society, volume 85, pages 454–458 (1963) and J. Polymer Science Part A Polymer Chemistry, volume 26, pages 1287–1294 (1988), can be utilized for the oxidative polymerization of thiophenes. According to a seventh embodiment of the present invention, the inexpensive and easily accessible oxidation agents such as iron (III) salts such as $FeCl_3$, the iron (III) salts of organic acids, e.g. $Fe(OTs)_3$, $H_2O_2$, $K_2Cr_2O_7$, alkali and ammonium persulphates, alkali perborates and potassium permanganate are used in the oxidative polymerization.

Theoretically the oxidative polymerization of thiophenes requires 2.25 equivalents of oxidation agent per mole thiophene of formula (I) [see e.g. J. Polymer Science Part A Polymer Chemistry, volume 26, pages 1287–1294 (1988)]. In practice an excess of 0.1 to 2 equivalents of oxidation agent is used per polymerizable unit. The use of persulphates and iron(III) salts has the great technical advantage that they do not act corrosively. Furthermore, in the presence of particular additives oxidative polymerization of the thiophene compounds according to formula (I) proceeds so slowly that the thiophenes and oxidation agent can be brought together as a solution or paste and applied to the substrate to be treated. After application of such solutions or pastes the oxidative polymerization can be accelerated by heating the coated substrate as disclosed in U.S. Pat. No. 6,001,281 and WO 00/14139 herein incorporated by reference.

Reductive polymerization can be performed using the Stille (organotin) or Suzuki (organoboron) routes described in 2002 by Appperloo et al. in Chem. Eur. Journal, volume 8, pages 2384–2396, and as disclosed in 2001 in Tetrahedron Letters, volume 42, pages 155–157 and in 1998 in Macromolecules, volume 31, pages 2047–2056 respectively or with nickel complexes as disclosed in 1999 in Bull. Chem. Soc. Japan, volume 72, page 621 and in 1998 in Advanced Materials, volume 10, pages 93–116.

Structural units according to formula (I) can be chemically or electrochemically copolymerized with other thiophene monomer, such as optionally substituted 3,4-dialkoxythiophenes e.g. optionally substituted 3,4-alkylenedioxythiophenes, or polymerizable heterocyclic compounds such as pyrrole.

Suitable polysulpho-polymers, according to the present invention, include:

| | |
|---|---|
| POLYSULPHO-1 | poly(sulphonic acid) |
| POLYSULPHO-2 | poly[4-(2,3-dihydro-thieno[3,4-b][1,4]dioxin-2-ylmethoxy)-butane-1-sulphonic acid] (PEDOT-S) |
| POLYSULPHO-3 | polyvinylsulphonic acid |
| POLYSULPHO-4 | sodium salt of a poly[N-(1',1'-dimethyl-2'-sulpho-ethyl)-acrylamide] |
| POLYSULPHO-5 | sodium salt of a copolymer of 90% by weight N-(1',1'-dimethyl-2'-sulpho-ethyl)-acrylamide and 10% by weight acrylamide |
| POLYSULPHO-6 | sodium salt of a copolymer of 50 mol % ethylene glycol, 46.5 mol % terephthalic acid and 3.5 mol % 5-sulphoisophthalic acid |

All polysulpho-polymers exhibit electron-blocking properties for element thicknesses of 5 to 10 nm. However, of POLYSULPHO-1 to -6 only POLYSULPHO-2 exhibits equally or better electron-blocking properties at element thicknesses of 100 nm.

Surfactants

According to a twelfth embodiment of the layer configuration, according to the present invention, the element further contains a surfactant.

According to a thirteenth embodiment of the layer configuration, according to the present invention, the element further contains a non-ionic surfactant e.g. ethoxylated/fluoroalkyl surfactants, polyethoxylated silicone surfactants, polysiloxane/polyether surfactants, ammonium salts of perfluoroalkylcarboxylic acids, polyethoxylated surfactants and fluorine-containing surfactants.

Suitable non-ionic surfactants include:

| | |
|---|---|
| Surfactant no. 01 = | ZONYL ™ FSN, a 40% by weight solution of $F(CF_2CF_2)_{1-9}CH_2CH_2O(CH_2CH_2O)_xH$ in a 50% by weight solution of isopropanol in water where x = 0 to about 25, from DuPont; |
| Surfactant no. 02 = | ZONYL ™ FSN-100: $F(CF_2CF_2)_{1-9}CH_2CH_2O(CH_2CH_2O)_xH$ where x = 0 to about 25, from DuPont; |
| Surfactant no. 03 = | ZONYL ™ FS300, a 40% by weight aqueous solution of a fluorinated surfactant, from DuPont; |
| Surfactant no. 04 = | ZONYL ™ FSO, a 50% by weight solution of a mixture of ethoxylated non-ionic fluoro-surfactant with the formula: $F(CF_2CF_2)_{1-7}CH_2CH_2O(CH_2CH_2O)_yH$ where y = 0 to ca. 15 in a 50% by weight solution of ethylene glycol in water, from DuPont; |

-continued

| | |
|---|---|
| Surfactant no. 05 = | ZONYL ™ FSO-100, a mixture of ethoxylated non-ionic fluoro-surfactant from DuPont with the formula: $F(CF_2CF_2)_{1-7}CH_2CH_2O(CH_2CH_2O)_yH$ where y = 0 to ca. 15 from DuPont; |
| Surfactant no. 06 = | Tegoglide ™ 410, a polysiloxane-polymer copolymer surfactant, from Goldschmidt; |
| Surfactant no. 07 = | Tegowet ™, a polysiloxane-polyester copolymer surfactant, from Goldschmidt; |
| Surfactant no. 08 = | FLUORAD ™ FC431: $CF_3(CF_2)_7SO_2(C_2H_5)N—CH_2CO—(OCH_2CH_2)_nOH$ from 3M; |
| Surfactant no. 09 = | FLUORAD ™ FC126, a mixture of the ammonium salts of perfluorocarboxylic acids, from 3M; |
| Surfactant no. 10 = | Polyoxyethylene-10-lauryl ether |
| Surfactant no. 11 = | FLUORAD ™ FC430, a 98.5% active fluoro-aliphatic ester from 3M; |

According to a fourteenth embodiment of the layer configuration, according to the present invention, the element further contains an anionic surfactant.

Suitable anionic surfactants include:

| | |
|---|---|
| Surfactant no. 12 = | ZONYL ™ 7950, a fluorinated surfactant, from DuPont; |
| Surfactant no. 13 = | ZONYL ™ FSA, 25% by weight solution of $F(CF_2CF_2)_{1-9}CH_2CH_2SCH_2CH_2COOLi$ in a 50% by weight solution of isopropanol in water, from DuPont; |
| Surfactant no. 14 = | ZONYL ™ FSE, a 14% by weight solution of $[F(CF_2CF_2)_{1-7}CH_2CH_2O]_xP(O)(ONH_4)_y$ where x = 1 or 2; y = 2 or 1; and x + y = 3 in a 70% by weight solution of ethylene glycol in water, from DuPont; |
| Surfactant no. 15 = | ZONYL ™ FSJ, a 40% by weight solution of a blend of $F(CF_2CF_2)_{1-7}CH_2CH_2O]_xP(O)(ONH_4)_y$ where x = 1 or 2; y = 2 or 1; and x + y = 3 with a hydrocarbon surfactant in 25% by weight solution of isopropanol in water, from DuPont; |
| Surfactant no. 16 = | ZONYL ™ FSP, a 35% by weight solution of $[F(CF_2CF_2)_{1-7}CH_2CH_2O]_xP(O)(ONH_4)_y$ where x = 1 or 2; y = 2 or 1 and x + y = 3 in 69.2% by weight solution of isopropanol in water, from DuPont; |
| Surfactant no. 17 = | ZONYL ™ UR: $[F(CF_2CF_2)_{1-7}CH_2CH_2O]_xP(O)(OH)_y$ where x = 1 or 2; y = 2 or 1 and x + y = 3, from DuPont; |
| Surfactant no. 18 = | ZONYL ™ TBS: a 33% by weight solution of $F(CF_2CF_2)_{3-8}CH_2CH_2SO_3H$ in a 4.5% by weight solution of acetic acid in water, from DuPont; |
| Surfactant no. 19 = | ammonium salt of perfluoro-octanoic acid from 3M |

Binder

According to a fifteenth embodiment of the layer configuration, according to the present invention, the element further contains a binder.

Crosslinking Agent

According to a sixteenth embodiment of the layer configuration, according to the present invention, the element further contains a cross-linking agent.

Electroluminescent Phosphors

According to a seventeenth embodiment of the layer configuration, according to the present invention, the layer configuration further comprises a layer of an electroluminescent phosphor.

According to an eighteenth embodiment of the layer configuration, according to the present invention, the layer configuration further comprises a layer of an electroluminescent phosphor, wherein the electroluminescent phosphor belongs to the class of II-VI semiconductors e.g. ZnS, or is a combination of group II elements with oxidic anions, the most common being silicates, phosphates, carbonates, germanates, stannates, borates, vanadates, tungstates and oxysulphates. Typical dopants are metals and all the rare earths e.g. Cu, Ag, Mn, Eu, Sm, Tb and Ce.

According to a nineteenth embodiment of the layer configuration, according to the present invention, the layer configuration further comprises a layer of an electroluminescent phosphor, wherein the electroluminescent phosphor is ZnS doped with manganese, copper or terbium, or $CaGa_2S_4$ doped with cerium.

Dielectric Layer

According to a twentieth embodiment of the layer configuration, according to the present invention, the layer configuration further comprises a dielectric layer.

Any dielectric material may be used in the dielectric layer, with yttria and barium titanate being preferred e.g. the barium titanate paste LUXPRINT™ type 7153E high K dielectric insulator supplied by DuPont and the barium titanate paste ELECTRODAG™ EL-040 supplied by Acheson. A positive ion exchanger may be incorporated into the dielectric layer to capture any ions dissolving escaping from the phosphor of the light-emitting layer. The amount of ion exchanger in the dielectric layer has to be optimized so that it has a maximum effectiveness in reducing black spots while not reducing the initial brightness level. It is therefore preferred to add 0.5 to 50 parts by weight of ion exchanger to 100 parts by weight of the total amount of resin and dielectric material in the dielectric layer. The ion exchanger may be organic or inorganic.

Suitable inorganic ion exchangers are hydrated antimony pentoxide powder, titanium phosphate, salts of phosphoric acid and silicic acid and zeolite.

Support

According to a twenty-first embodiment of the layer configuration, according to the present invention, the support is transparent or translucent.

According to a twenty-second embodiment of the layer configuration, according to the present invention, the support is paper, polymer film, glass or ceramic.

According to a twenty-third embodiment of the layer configuration, according to the present invention, the support is a transparent or translucent polymer film.

A transparent or translucent support suitable for use with the electroconductive or antistatic layers, according to the present invention, may be rigid or flexible and consist of a glass, a glass-polymer laminate, a polymer laminate, a thermoplastic polymer or a duroplastic polymer. Examples of thin flexible supports are those made of a cellulose ester, cellulose triacetate, polypropylene, polycarbonate or polyester, with poly(ethylene terephthalate) or poly(ethylene naphthalene-1,4-dicarboxylate) being particularly preferred.

Electroluminescent Devices

According to a twenty-fourth embodiment of the layer configuration, according to the present invention, the layer configuration is an electroluminescent device.

According to a twenty-fifth embodiment of the layer configuration, according to the present invention, the layer configuration is a light emitting diode.

Thin film electroluminescent devices (ELDs) are all characterized by one (or more) electroluminescent active layer(s)

sandwiched between two electrodes. Optionally a dielectric layer may also be part of the sandwich.

Thin film ELDs can be subdivided into organic and inorganic based ELDs. Organic-based thin film ELDs can be subdivided into low molecular weight organic devices including oligomers (Organic Light Emitting Diodes (OLEDs)) and high molecular weight organic devices (Polymer Light Emitting Diodes (PLEDs). The inorganic ELDs on the other hand can be further subdivided into the High Voltage Alternating Current (HV-AC) ELDs and the Low Voltage Direct Current (LV-DC) ELDs. The LV-DC ELDs include Powder ELDs (DC-PEL Devices or DC-PELDs) and thin film DC-ELDs, hereinafter called Inorganic Light Emitting Diodes (ILEDs).

The basic construction of organic ELDs (PLED and OLED) comprises following layer arrangement: a transparent substrate (glass or flexible plastic), a transparent conductor, e.g. Indium Tin Oxide (ITO), a hole transporting layer, a luminescent layer, and a second electrode, e.g. a Ca, Mg/Ag or Al/Li electrode. For OLEDs the hole transporting layer and the luminescent layer are 10–50 nm thick and applied by vacuum deposition, whereas for PLEDs the hole transporting layer is usually about 40 nm thick and the luminescent layer is usually about 100 nm thick and applied by spin coating or other non-vacuum coating techniques. A direct voltage of 5–10 V is applied between both electrodes and light emission results from holes and electrons being injected from the positive and negative electrodes respectively combining in the luminescent layer thereby producing the energy to excite the luminescent species to emit light.

In OLEDs the hole transporting layer and electroluminescent layer consist of low molecular organic compounds, N,N'-diphenyl-1,1'-biphenyl-4,4'-diamine (TPD) can, for example be used as the hole transporter and aluminium (III) 8-hydroxyquinoline complex ($Alq_3$), polyaromatics (anthracene derivatives, perylene derivatives and stilbene derivatives) and polyhetero-aromatics (oxazoles, oxadiazoles, thiazoles etc.) can be used as electroluminescent compounds.

In PLEDs electroluminescent compounds that can be used are polymers like the non-conjugated polyvinylcarbazole derivatives (PVK) or conjugated polymers like poly(p-phenylene vinylenes) (PPV), polyfluorenes, poly(3-alkylthiophene), poly(p-phenylene ethynylenes) etc. These high-molecular-weigth materials allow for the easy preparation of thin films by casting, and show a high resistance to crystallization.

Low voltage DC PEL Devices generally comprise a transparent substrate, a transparent conductor (ITO), a doped ZnS phosphor layer (20 $\mu$m), and a top electrode of evaporated aluminium. The phosphor layer is applied by means of the doctor blade technique or screen printing on an ITO conducting layer. Subsequently an aluminium electrode is applied by evaporation. Upon applying a direct current voltage of several volts (ITO positive), holes start moving towards the aluminium electrode, thereby creating an insulating region (about 1 $\mu$m in thickness) next to the ITO layer within one minute or so. This results in a current drop which is associated with the onset of light emission. This process has been called the forming process. In the thin high resistive phosphor layer thereby formed, high electric fields occur and electroluminescence is already possible at low voltages (typically between 10 and 30 V). Que et al. [see Appl. Phys. Lett., volume 73, pages 2727–2729 (1998)] using ZnS:Cu nano crystals achieved turn on voltages of below 5 V.

In hybrid LEDs, inorganic emitting so-called quantum dots are used in combination with organic polymers with charge transporting properties and in some cases also emitting properties. Hybrid LEDs with CdSe nano particles have been reported by Colvin et al. [see Nature, volume 370, pages 354–357, (1994)], Dabbousi et al. [see Appl. Phys. Lett., volume 66, pages 1316–1318 (1995), and Gao et al. [see J. Phys. Chem. B, volume 102, pages 4096–4103 (1998)]; and with ZnS:Cu nano crystals have been reported by Huang et al. [see Appl. Phys. Lett., volume 70, pages 2335–2337 (1997)] all included herein by reference.

Photovoltaic Devices

According to a twenty-sixth embodiment of the layer configuration, according to the present invention, the layer configuration is a photovoltaic device.

According to a twenty-seventh embodiment of the layer configuration, according to the present invention, the layer configuration further comprises at least one photovoltaic layer. The photovoltaic layer may be organic layer, a hybrid inorganic and organic layer or an inorganic layer.

According to a twenty-eighth embodiment of the layer configuration, according to the present invention, the layer configuration is a solar cell.

Photovoltaic devices incorporating the layer configuration, according to the present invention, can be of two types: the regenerative type which converts light into electrical power leaving no net chemical change behind in which current-carrying electrons are transported to the anode and the external circuit and the holes are transported to the cathode where they are oxidized by the electrons from the external circuit and the photosynthetic type in which there are two redox systems one reacting with the holes at the surface of the semiconductor electrode and one reacting with the electrons entering the counter-electrode, for example, water is oxidized to oxygen at the semiconductor photoanode and reduced to hydrogen at the cathode. In the case of the regenerative type of photovoltaic cell, as exemplified by the Graetzel cell, the hole transporting medium may be a liquid electrolyte supporting a redox reaction, a gel electrolyte supporting a redox reaction, an organic hole transporting material, which may be a low molecular weight material such as 2,2',7,7'-tetrakis(N,N-di-p-methoxyphenyl-amine)9,9'-spirobifluorene (OMeTAD) or triphenylamine compounds or a polymer such as PPV-derivatives, poly(N-vinylcarbazole) etc., or inorganic semiconductors such as CuI, CuSCN etc. The charge transporting process can be ionic as in the case of a liquid electrolyte or gel electrolyte or electronic as in the case of organic or inorganic hole transporting materials.

Such regenerative photovoltaic devices can have a variety of internal structures in conformity with the end use. Conceivable forms are roughly divided into two types: structures which receive light from both sides and those which receive light from one side. An example of the former is a structure made up of a transparently conductive layer e.g. an ITO-layer or a PEDOT/PSS-containing layer and a transparent counter electrode electrically conductive layer e.g. an ITO-layer or a PEDOT/PSS-containing layer having interposed therebetween a photosensitive layer and a charge transporting layer. Such devices preferably have their sides sealed with a polymer, an adhesive or other means to prevent deterioration or volatilization of the inside substances. The external circuit connected to the electrically-conductive substrate and the counter electrode via the respective leads is well-known.

Organic photovoltaic layers of the layer configuration, according to the present invention are, for example, mixtures of fullerene molecules (as electron acceptor and electron transporter) with conjugated polymers (e.g. substituted polyphenylenevinylene (PPV) (as light absorber and hole transporter)[see Brabec et al., Adv. Funct. Mater., volume 11(1), pages 15–26 (2001)]. In 1995 Halls et al. reported in Nature, volume 376, page 498 the successful use of acceptor-type conjugated polymers instead of fullerenes.

Alternatively the layer configuration, according to the present invention, can be incorporated in hybrid photovoltaic compositions such as described in 1991 by Graetzel et al. in Nature, volume 353, pages 737–740, in 1998 by U. Bach et al. [see Nature, volume 395, pages 583–585 (1998)] and in 2002 by W. U. Huynh et al. [see Science, volume 295, pages 2425–2427 (2002)]. In all these cases, at least one of the components (light absorber, electron transporter or hole transporter) is inorganic (e.g. nano-$TiO_2$ as electron transporter, CdSe as light absorber and electron transporter) and at least one of the components is organic (e.g. triphenylamine as hole transporter or poly(3-hexylthiophene) as hole transporter).

Inorganic photovoltaic layers which can be used in the layer configuration according to this invention are described in EP-A 1 176 646.

Transistors

According to a twenty-ninth embodiment of the layer configuration, according to the present invention, the layer configuration further comprises a layer with one or more of the electron transporting or hole transporting components described above, but within such a configuration that it can be used as a transistor. The semiconductor can be n-type, p-type or both (ambipolar transistor) and can be either organic or inorganic.

INDUSTRIAL APPLICATION

Layer configurations-comprising an element, according to the present invention, between a positive electrode and a material capable of hole transport and capable of reducing hole-electron recombination at the positive electrode can be used in a wide range of electronic devices such as photovoltaic devices, solar cells, batteries, capacitors, light emitting diodes, organic and inorganic electroluminescent devices, smart windows, electrochromic devices, sensors for organic and bio-organic materials and field effect transistors [see also chapter 10 of the Handbook of Oligo- and Polythiophenes, Edited by D. Fichou, Wiley-VCH, Weinheim (1999)].

The invention is illustrated hereinafter by way of reference light emitting devices and light emitting devices according to the present invention. The percentages and ratios given in these examples are by weight unless otherwise indicated.

Synthesis of PEDOT-S

Synthesis of 2-acetoxymethyl-2,3-dihydro-thieno[3,4-b][1,4]dioxine-5,7-dicarboxylic acid dimethyl ester

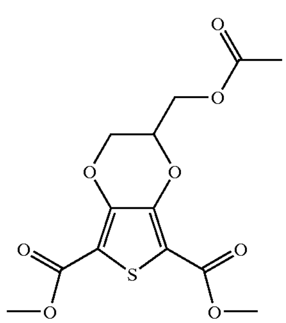

A 70/30 molar mixture of 2-acetoxymethyl-2,3-dihydro-thieno[3,4-b][1,4]dioxine-5,7-dicarboxylic acid dimethyl ester and 3-acetoxy-3,4-dihydro-2H-thieno[3,4-b][1,4]dioxepine-6,8-dicarboxylic acid dimethyl ester was obtained by performing the reaction between 3,4-dihydroxythiophene-2,5-dicarboxylic acid dimethyl ester and epibromohydrin as described in U.S. Pat. No. 5,111,327. This mixture was subsequently separated by an acetylation/selective crystallization procedure: the 70/30 molar mixture of 2-acetoxymethyl-2,3-dihydro-thieno[3,4-b][1,4]dioxine-5,7-dicarboxylic acid dimethyl ester and 3-acetoxy-3,4-dihydro-2H-thieno[3,4-b][1,4]dioxepine-6,8-dicarboxylic acid dimethyl ester (143 g, 0.496 mol) was dissolved in methylene chloride (1.5 L). Triethylamine (80 mL) was subsequently added after which acetyl chloride (43 mL) was added dropwise, constantly keeping the reaction around 25° C. by slight cooling. After addition the mixture was stirred for another hour at 25° C.

Subsequently, the reaction mixture was washed several times with aqueous HCl (1M), aqueous NaHCO3 (1M) and saturated aqueous NaCl, respectively. The solvent was removed and the resulting solid was recrystallized from ethanol. After filtration and washing of the residue, pure 2-acetoxymethyl-2,3-dihydro-thieno[3,4-b][1,4]dioxine-5,7-dicarboxylic acid dimethyl ester was obtained as demonstrated by NMR and mass spectroscopy.

Synthesis of 2-hydroxymethyl-2,3-dihydro-thieno[3,4-b][1,4]dioxine-5,7-dicarboxylic acid

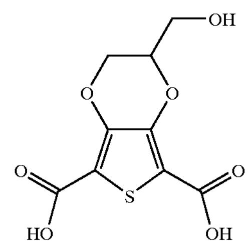

2-Acetoxymethyl-2,3-dihydro-thieno[3,4-b][1,4]dioxine-5,7-dicarboxylic acid dimethyl ester (60 g, 0.18 mol) was dissolved in ethanol (680 mL). KOH (36 g) was added to this solution after which water (500 mL) was added upon continuous cooling. After addition of the water the reaction mixture was stirred for another 30 minutes after which the solvents were removed by distillation. To the remaining part of the reaction mixture, we dropwise added a mixture of ice (50 g) and concentrated HCl (25 mL), and stirred. The mixture was then filtered and the residue was washed with water. Subsequent drying resulted in quantitative formation of pure 2-hydroxymethyl-2,3-dihydro-thieno[3,4-b][1,4]dioxine-5,7-dicarboxylic acid as demonstrated by NMR and mass spectroscopy.

Synthesis of (2,3-dihydro-thieno[3,4-b][1,4]dioxin-2-yl)-methanol

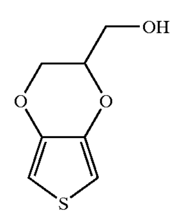

2-Hydroxymethyl-2,3-dihydro-thieno[3,4-b][1,4]dioxine-5,7-dicarboxylic acid (48 g, 0.184 mol) was dissolved in N,N-dimethylacetamide (500 mL), and $Cu_2Cr_2O_7$ (8.6 g)

and quinoline (15 drops) were added. This mixture was subsequently stirred for 2 hours at 150° C., after which it was cooled to 25° C. It was then poured into ethyl acetate, the catalyst was removed by filtration and the filtrate was washed with acidic water and aqueous, saturated NaCl. Subsequently, the solvent was removed after which pure (2,3-dihydro-thieno[3,4-b][1,4]dioxin-2-yl)-methanol was isolated by vacuum distillation (115–120° C.; 0.05 mm Hg).

Synthesis of 4-(2,3-dihydro-thieno[3,4-b][1,4] dioxin-2-yl-methoxy)-butane-1-sulphonic acid sodium salt

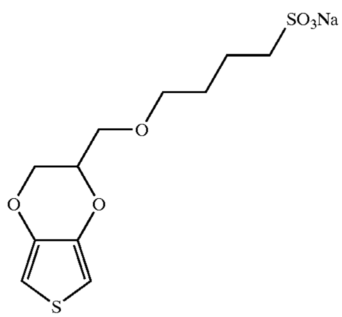

(2,3-Dihydro-thieno[3,4-b][1,4]dioxin-2-yl)-methanol (6.9 g, 40 mmol) was dissolved into tetrahydrofuran (100 mL) and blanketed by nitrogen. NaH (1.76 g) was added and stirring was continued for 30 min. Then butanesultone (6.0 g) was added dropwise after which the reaction mixture was brought to reflux for 3 h. Then it was cooled to 25° C. again, the solvent was removed, methanol was added, the mixture was stirred, filtered and the filtrate was concentrated. The remaining oil was solidified by addition of hexane and ethanol, followed by stirring. Final filtration and drying resulted in pure 4-(2,3-dihydro-thieno[3,4-b][1,4]dioxin-2-ylmethoxy)-butane-1-sulphonic acid sodium salt as was demonstrated by NMR and mass spectroscopy.

Chemical Polymerization of 4-(2,3-dihydro-thieno [3,4-b][1,4]-dioxin-2-ylmethoxy)-butane-1-sulphonic acid sodium salt 4-(2,3-dihydro-thieno[3,4-b][1,4]dioxin-2-ylmethoxy)-butane-1-sulphonic acid sodium salt (0.66 g, 2.0 mmol) was dissolved in oxygen-free water (20 mL). The solution was heated to 80° C. after which $Fe(OTs)_3.6H_2O$ (4.06 g, 6.0 mmol) was added. The colour of the solution immediately turned dark blue. The reaction mixture was kept at 80° C. for 3.5 h more, after which it was cooled and filtered. The filtrate was finally freed of iron, sodium and tosylate ions by ion exchange with cationic and anionic resins resulting in a dark blue aqueous PEDOT-S solution. The solution was finally diluted with deionized water to 1% by weight PEDOT-S.

Light Emitting Devices 1 to 5

Preparation of the Electroluminescent ZnS:Cu Dispersion

The following solutions were prepared:

| | | |
|---|---|---|
| Solution 1 | zinc acetate dihydrate | 131,7 g |
| | copper acetate monohydrate | 0,54 g |
| | deionized water | to 600 mL |

-continued

| | | |
|---|---|---|
| Solution 2 | sodium sulphide nonahydrate | 113,6 g |
| | ammonia (50%) | 5 mL |
| | deionized water | to 600 mL |
| Solution 3 | TRI* | 40 g |
| | deionized water | to 1000 mL |
| | sodium chloride | 58,44 g |

*TRI = (5-methyl-1,2,4-triazolo-(1,5-a)-pyrimidine-7-ol)

Solutions 1 and 2 at room temperature were added simultaneously both at a flow rate of 500 mL/min to solution 3, held at room temperature and stirred at 1500 rpm for 60 s. To 1000 mL of the resulting dispersion, 1000 mL of a 1% polyphosphoric acid solution adjusted to pH 6 with ammonium hydroxide was added and the dispersion was concentrated to 1000 mL by means ultrafiltration using a Fresenius F60 cartridge. This dispersion was subsequently diafiltered by using 5500 mL of a 1% solution of polyphosphoric acid solution adjusted to pH 6 with ammonium hydroxide solution in water. The dispersion was further concentrated to a volume of about 570 mL to produce an aqueous dispersion at pH 6 containing 30 g/L ZnS:Cu and 1% polyphosphoric acid. The dispersion was then ball-milled for 1 hour. 20 mL of the resulting dispersion was then ultrasonically treated with a ultrasound bar (Vibra cell VCX 400 W from Sonics & Materials Inc.—amplitude about 78%—output 40%) for 3 minutes while cooling in ice. 3.2 g of a 5% by weight aqueous solution of poly(vinylpyrrolidone) in water was then added to 16.8 g of the ZnS:Cu dispersion followed by further ultrasonic treatment with the ultrasound bar for 5 minutes. 0.5 mL of ZONYL™ FSO100 was then added as a 1% by weight aqueous solution followed by thorough stirring. The resulting dispersion was then filtered through a 5 μm MILLIPORE™ filter, a nano-dispersion of electroluminescent ZnS:Cu being thereby produced.

Preparation of the Patterned ITO Electrode

An indium tin oxide [ITO] layer on 175 μm thick poly (ethylene terephthalate) [PET] from IST, with a surface resistance of about 80 Ohm/square, was used as the hole-conducting electrode. ITO/PET sheets of 5×5 $cm^2$ were taped off in the middle of the plate with a 2 cm Magic tape Scotch 810 from 3M. The sides of the ITO plates were etched with a solution consisting of 50 mL of concentrated hydrochloric acid, 50 mL of deionized water and 4 mL of concentrated nitric acid. After the etching, the ITO/PET sheets were rinsed with water several times and subsequently dried with a hair dryer. After drying, the tape was removed and the sheets were put into a vessel with isopropanol which was put into an ultrasound bath for 10 minutes. Afterwards they were dried at 50° C. for 10 minutes. Each ITO/PET sheet contained a band of 2 cm of conductive ITO in the middle.

Preparation and Application of the Element Between the Patterned ITO Electrode and the Electroluminescent Layer The solutions/dispersions 4 to 7 were prepared by stirring the ingredients in Table 1 together in the quantities given therein.

TABLE 1

| solution | polyvinylsulphate | | 5% ZONYL FSO100 | deionized | solution |
|---|---|---|---|---|---|
| nr | type | weight [g] | in $H_2O$ [g] | water [g] | pH |
| 4 | 01 | 0.3 | 1 | 48.7 | 1.9 |
| 5 | 02 | 1.2* | 1 | 47.8 | 8.1 |
| 6 | 01 | 0.65 | 1 | 48.35 | 1.9 |
| 7 | 02 | 2.6* | 1 | 46.4 | 8.1 |

*as 25% by weight aqueous solution

Solutions 4 and 6 were spincoated on patterned ITO/PET sheets at 800 rpm for 6 s and then at 4000 rpm for 50 s and the elements dried at 40° C. for 10 minutes. This resulted in element thicknesses of about 5 to 10 nm, thereby producing the substrates for devices 2 and 4 respectively.

Solutions 5 and 7 were spincoated on patterned ITO/PET at 800 rpm for 6 s and then at 1500 rpm for 50 s and the elements dried at 40° C. for 10 minutes. This resulted in element thicknesses of about 100 nm, thereby producing the substrates for device 3 and 5 respectively.

The thicknesses were measured with a DEKTAK™ profilometer with the element spincoated on glass. Similar element thicknesses can be expected on ITO/PET.

Application of the Electroluminescent Layer

The electroluminescent nano ZnS:Cu-dispersion was spincoated at 1000 rpm for 6 s and then at 2000 rpm for 50 s on the substrates of devices 1 to 5, device 1 without an elctron blocking element and devices 2 to 5 with the above-described electron blocking elements. The resulting electroluminescent ZnS:Cu-layers were then dried at 50° C. for 10 minutes, a thickness of 100 nm being thereby obtained.

Application of the Aluminium Electrode

Subsequently, a 160 nm thick aluminium electrode (cathode) was vacuum deposited on the spincoated double layers at a vacuum of $1.33\times10^{-4}$ N $m^{-2}$ Pa using a mask. The emission area was 25 $mm^2$. The device construction is shown in FIG. 1.

Performance of the Light Emitting Devices

The results of the light emitting devices produced without the additional layer between the patterned ITO-electrode and the ZnS:Cu luminescent layer, light emitting device 1, and with the different layers, light emitting devices 2 to 4, are given in Table 2.

TABLE 2

| Device nr. | element | pH | Thickness of element [nm] | Life-time [sec] | Optimum voltage [V] |
|---|---|---|---|---|---|
| 1 (ref.) | No | — | — | 25 | 8.0 |
| 2 (inv.) | POLYSULPHATO-01 | 1.9 | 5 | 42 | 7.0 |
| 3 (inv.) | POLYSULPHATO-01 | 1.9 | 100 | 410 | 5.5 |
| 4 (inv.) | POLYSULPHATO-02 | 8.3 | 5 | 47 | 6.8 |
| 5 (inv.) | POLYSULPHATO-02 | 8.3 | 100 | 266 | 5.6 |

It should be noted that the lifetime of these light emitting devices was found to be dependent upon the relative humidity pertaining at the time the devices were produced, decreasing with increasing ambient relative humidity. The lifetimes of reference devices without the additional element between the patterned ITO-electrode and the ZnS:Cu luminescent layer varied between 25 and 793 s during the research resulting in the present invention. Therefore, results from series of devices produced on different days can only be directly compared with one another, if the performances of the reference devices without the additional element between the patterned ITO-electrode and the ZnS:Cu luminescent layer were comparable.

At a forward bias, the devices exhibited electroluminescence with a λmax of 490 nm. For the lifetime measurements, a forward bias was applied and the voltage was increased so as to keep the light output constant at ca. 0.5 Cd/$m^2$. The maximum voltage was 12 V. The lifetime of the light emitting device was taken to be the time between the application of the optimum voltage and the moment no further electroluminescence could be observed. The optimum voltage was that voltage at which maximum light output was observed.

It can be concluded from Table 2 that the presence of an element containing a polysulphato-polymer between the hole conductor (ITO) and the electroluminescent layer improves the lifetime of the devices. This can probably be explained by preventing electrons reaching the ITO layer. Indeed it was found that the (surface) resistance of the ITO after the lifetime experiments had substantially increased to greater than 1000 ohm/square, indicating that recombination of electrons and holes had taken place in the ITO layer. Furthermore, there was a significant increase in lifetime between 5 nm and 100 nm elements of polysulphato-polymers.

Light Emitting Devices 6 to 16

Devices 6 to 16 were prepared as described for Devices 2 to 4 except that the patterned ITO electrode was coated with elements incorporating different polysulpho-polymers. Solutions 22 to 31, used for preparing these elements, prepared as described for Solutions 4 to 7, are given below in Table 3.

Solutions 8, 10, 12, 14, 15 and 16 were spincoated on patterned ITO/PET at 800 rpm for 6 s and then at 4000 rpm for 50 s and the elements dried at 40° C. for 10 minutes. This resulted in element thicknesses of about 5 to 10 nm. The substrates for devices 7, 9, 11, 13, 14 and 15 were thereby produced.

Solutions 9, 11, 13 and 17 were spincoated on patterned ITO/PET sheets at 800 rpm for 6 s and then at 1500 rpm for 50 s and the elements dried at 40° C. for 10 minutes. This resulted in element thicknesses of about 100 nm, thereby producing the substrates for devices 8, 10, 12 and 16 respectively.

TABLE 3

| solution | POLYSULPHO-polymer | | 5% ZONYL ™ FSO100 in | deionized | solution |
|---|---|---|---|---|---|
| nr | nr | weight [g] | $H_2O$ | water [g] | pH |
| 8 | 01 | 2* | 0.8 | 17.2 | 1.75 |
| 9 | 01 | 4.1* | 0.8 | 15.1 | 1.75 |
| 10 | 02 | 3# | 0.2 | 1.8 | 2.1 |
| 11 | 02 | 2# | 0.1 | — | 2.1 |
| 12 | 03 | 0.3 | 1 | 48.7 | 1.4 |
| 13 | 03 | 0.65 | 1 | 48.35 | 1.4 |
| 14 | 04 | 0.3 | 1 | 48.7 | 1.2 |
| 15 | 05 | 0.3 | 1 | 48.7 | 6.1 |
| 16 | 06 | 0.3 | 1 | 48.7 | 4.3 |
| 17 | 06 | 0.65 | 1 | 48.35 | 4.3 |

*6% PSS (>90% sulphonated, $M_n$ ca 40.000 and $M_w$ ca 250.000) in water at pH = 1.75;
#1% PEDOT-S in water at pH = 2.1

Performance of the Light Emitting Devices

The results for light emitting Devices 7 to 16, obtained as for light emitting devices 1 to 5, are given in Table 4 together with the results of reference light emitting device 6 simultaneously coated and with the same configuration other than the absence of an electron blocking layer.

TABLE 4

| Device nr. | element | pH | Thickness of element [nm] | Life-time [s] | Optimum voltage [V] |
|---|---|---|---|---|---|
| 6 (ref.) | No | — | — | 25 | 8.0 |
| 7 (inv.) | POLYSULPHO-01 (PSS) | 1.75 | 5 | 195 | 6.5 |
| 8 (inv.) | POLYSULPHO-01 (PSS) | 1.75 | 100 | 65 | 7.5 |
| 9 (inv.) | POLYSULPHO-02 (PEDOT-S) | 2.1 | 5 | 30 | 7.8 |
| 10 (inv.) | POLYSULPHO-02 (PEDOT-S) | 2.1 | 100 | 43 | 7.0 |
| 11 (inv.) | POLYSULPHO-03 | 1.4 | 5 | 75 | 6.7 |
| 12 (inv.) | POLYSULPHO-03 | 1.4 | 100 | 72 | 6.5 |
| 13 (inv.) | POLYSULPHO-04 | 1.2 | 5 | 60 | 6.8 |
| 14 (inv.) | POLYSULPHO-05 | 6.1 | 5 | 100 | 6.5 |
| 15 (inv.) | POLYSULPHO-06 | 4.3 | 5 | 60 | 6.5 |
| 16 (inv.) | POLYSULPHO-06 | 4.3 | 100 | 27 | 7.0 |

It can be concluded from Table 4 that the presence of an element containing a polysulpho-polymer between the hole conductor (ITO) and the electroluminescent layer improves the lifetime of the devices for thicknesses of 5 nm or 100 nm or for both 5 nm and 100 nm.

In the cases of devices with 5 nm POLYSULPHO-polymer elements, there is a substantial improvement over the reference device, device 6, for all the devices except the device with POLYSULPHO-2, which exhibited only a slightly improved lifetime with respect to the reference device.

In the cases of devices with 100 nm POLYSULPHO-polymer elements, there is an improvement over the reference device, device 6, for the devices with POLYSULPHO-1, POLYSULPHO-2 and POLYSULPHO-3 elements, whereas the device with a POLSULPHO-6 element exhibited only a slightly improved lifetime with respect to the reference device.

This can probably be explained by preventing electrons reaching the ITO layer. Indeed it was found that the (surface) resistance of the ITO after the lifetime experiments had substantially increased to greater than 1000 ohm/square, indicating that recombination of electrons and holes had taken place in the ITO layer.

Furthermore, devices with 5 nm and 100 nm POLYSULPHO-polymer elements either exhibited comparable lifetimes or a decrease in lifetime between element thicknesses of 5 nm and 100 nm.

Light Emitting Devices 17 and 18

Devices 17 and 18 were prepared as described for Devices 2 to 4 except that the patterned ITO electrode was coated with elements incorporating poly(vinyl phosphonic acid). Solutions 32 and 33, used for preparing these elements, prepared as described for Solutions 2 to 4, are given below in Table 5.

Solution 18 was spincoated on patterned ITO/PET at 800 rpm for 6 s and then at 4000 rpm for 50 s and the elements dried at 40° C. for 10 minutes. This resulted in an element thickness of about 5 to 10 nm, thereby producing the substrate for device 17.

Solution 19 was spincoated on patterned ITO/PET sheets at 800 rpm for 6 s and then at 1500 rpm for 50 s and the elements dried at 40° C. for 10 minutes. This resulted in an element thickness of about 100 nm, thereby producing the substrate for device 18.

TABLE 5

| solution nr | weight of polyvinyl phosphonic acid [g] | 5% ZONYL FSO100 in $H_2O$ [g] | deionized water [g] | solution pH |
|---|---|---|---|---|
| 18 | 0.3 | 1 | 48.7 | 1.4 |
| 19 | 0.65 | 1 | 48.35 | 1.4 |

Performance of the Light Emitting Devices

The results for light emitting devices 17 and 18 obtained as for light emitting devices 1 to 5, are given in Table 6 together with the results of light emitting device 6 as a reference.

TABLE 6

| Device nr. | element | pH | Thickness of element [nm] | Life-time [s] | Optimum voltage [V] |
|---|---|---|---|---|---|
| 6 (ref.) | No | — | — | 25 | 8.0 |
| 17 (inv.) | poly(vinylphosphonic acid) | 1.4 | 5 | 220 | 6.0 |
| 18 (inv.) | poly(vinylphosphonic acid) | 1.4 | 100 | 35 | 5.8 |

It can be concluded from Table 6 that the presence of an element of poly(vinylphosphonic acid) between the hole conductor (ITO) and the electroluminescent layer improves the lifetime of the devices for both thicknesses of 5 nm and 100 nm. This can probably be explained by preventing electrons reaching the ITO layer. Indeed it was found that the (surface) resistance of the ITO after the lifetime experiments had substantially increased to greater than 1000 ohm/square, indicating that recombination of electrons and holes had taken place in the ITO layer.

Furthermore, devices with 5 nm and 100 nm poly (vinylphosphonic acid) elements exhibited a decrease in lifetime between element thicknesses of 5 nm and 100 nm.

Light-Emitting Devices 19 and 20

Preparation of Electroluminescent Devices

The electroluminescent devices of LIGHT-EMITTING DEVICES 19 and 20 were prepared either using an indium tin oxide [ITO] layer on 175 $\mu$m thick poly(ethylene terephthalate) [PET] from IST, with a surface resistance of about 60 Ohm/square as the support as follows:

optional coating the ITO layer of the support with a 20 mg/m element of poly(styrene sulphonic acid);

then screen printing the transparent electrode or poly (styrene sulphonic acid element) with a DuPont LUXPRINT® type 7151J electroluminescent phosphor paste;

then printing 2 layers of the DuPont LUXPRINT® type 7153E high K dielectric insulator ink (barium titanate);

then printing a layer of the DuPont LUXPRINT® type 7144 carbon conductor ink (resistance of about 40 ohm/square), as the second electrode.

Bus-bars were applied to the transparent electrode with DuPont LUXPRINT® type 7145L silver conductor ink.

Evaluation of the Electroluminescent Devices

The performance of light emitting devices 19 and 20 were evaluated in simulated endurance tests over a period of 13 days by monitoring the emission of the devices with a United Detector Technology Serial # 67146 silicon photomultiplier in contact with the non-coated side of the support when an AC voltage of 100V at 400 Hz was applied to the electroluminescent devices in a conditioning chamber having a temperature of 60° C. and a relative humidity of 90%. The initial emission in cd/$m^2$ and the emission half-lives of the devices are given in Table 7. The percentage of initial resistance after 5 days was determined with a pair of devices, in which a voltage is only applied to one device and the resistance of the device to which a voltage had been applied monitored with respect to the resistance of an identical device to which no voltage had been applied. The results expressed as a relative percentage with respect to the device to which no voltage had been applied are given in the final column of Table 7.

TABLE 7

| Device nr | Initial light emission [cd/$m^2$] | Emission half-life [h] | % age of initial emission after 120 h | Homogeneity of light emission |
|---|---|---|---|---|
| 19 | 41 | 120 | 50 | no black spots developed |
| 20 | 42 | 120 | 50 | black spots developed |

The presence of a poly(styrene sulphonic acid) element between the ITO layer of the support and the electroluminescent layer prevented the development of non-emitting areas of the electroluminescent device visible as black spots.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

Having described in detail preferred embodiments of the current invention, it will now be apparent to those skilled in the art that numerous modifications can be made therein without departing from the scope of the invention as defined in the following claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and-the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A layer configuration on a support, said layer configuration comprising a non-photoactive element exclusive of poly(3,4-alkylenedioxythiophene)s, poly(3,4-dialkoxythiophene)s, polyanilines and polypyrroles, said element containing at least one polymer selected from the group consisting of polysulphato-polymers and polysulpho-polymers, the surface of one side of said element being contiguous with a positive electrode and the surface on the opposite side of said element being contiguous with a material capable of transporting holes.

2. Layer configuration according to claim 1, wherein said polysulphato-polymer is polyvinylsulphate.

3. Layer configuration according to claim 1, wherein said polysulpho-polymer is selected from the group consisting of: poly(styrene sulphonic acid), homo- and copolymers of 4-(2,3-dihydro-thieno[3,4-b][1,4]dioxin-2-ylmethoxy)-butane-1-sulphonic acid, polyvinylsulphonic acid, homo and copolymers of N-(1',1'-dimethyl-2'-sulpho-ethyl) acrylamide, and copolymers of ethylene glycol, terephthalic acid and 5-sulpho-isophthalic acid.

4. A light emitting diode consisting of a layer configuration on a support, said layer configuration comprising a non-photoactive element exclusive of poly(3,4-alkylenedioxythiophene)s, poly(3,4-dialkoxythiophene)s, polyanilines and polypyrroles, said element containing at least one polymer selected from the group consisting of polysulphato-polymers and polysulpho-polymers, the surface of one side of said element being contiguous with a positive electrode and the surface on the opposite side of said element being contiguous with a material capable of transporting holes according to claim 1.

5. Light emitting diode according to claim 4, wherein said polysulphato-polymer is polyvinylsuiphate.

6. Light emitting diode according to claim 4, wherein said polysulpho-polymer is selected from the group consisting of: poly(styrene sulphonic acid), homo- and copolymers of 4-(2,3-dihydro-thieno[3,4-b][1,4]dioxin-2-ylmethoxy)-butane-1-sulphonic acid, polyvinylsulphonic acid, homo and copolymers of N-(1',1'-dimethyl-2'-sulpho-ethyl) acrylamide, and copolymers of ethylene glycol, terephthalic acid and 5-sulpho-isophthalic acid.

7. A photovoltaic device consisting of a layer configuration on a support, said layer configuration comprising a non-photoactive element exclusive of poly(3,4-alkylenedioxythiophene)s, poly(3,4-dialkoxythiophene)s, polyanilines and polypyrroles, said element containing at least one polymer selected from the group consisting of polysulphato-polymers and polysulpho-polymers, the surface of one side of said element being contiguous with a positive electrode and the surface on the opposite side of said element being contiguous with a material capable of transporting holes.

8. Photovoltaic device according to claim 7, wherein said polysulphato-polymer is polyvinylsuiphate.

9. Photovoltaic device according to claim 7, wherein said polysulpho-polymer is selected from the group consisting of: poly(styrene sulphonic acid), homo- and copolymers of 4-(2,3-dihydro-thieno[3,4-b][1,4]dioxin-2-ylmethoxy)-butane-1-sulphonic acid, polyvinylsulphonic acid, homo and copolymers of N-(1',1'-dimethyl-2'-sulpho-ethyl)

acrylamide, and copolymers of ethylene glycol, terephthalic acid and 5-sulpho-isophthalic acid.

10. A transistor consisting of a layer configuration on a support, said layer configuration comprising a non-photoactive element exclusive of poly(3,4-alkylenedioxythiophene)s, poly(3,4-dialkoxythiophene)s, polyanilines and polypyrroles, said element containing at least one polymer selected from the group consisting of polysulphato-polymers and polysulpho-polymers, the surface of one side of said element being contiguous with a positive electrode and the surface on the opposite side of said element being contiguous with a material capable of transporting holes.

11. Transistor according to claim 10, wherein said polysulphato-polymer is polyvinylsulphate.

12. Transistor according to claim 10, wherein said polysulpho-polymer is selected from the group consisting of: poly(styrene sulphonic acid), homo- and copolymers of 4-(2,3-dihydro-thieno[3,4-b][1,4]dioxin-2-ylmethoxy)-butane-1-sulphonic acid, polyvinylsulphonic acid, homo and copolymers of N-(1',1'-dimethyl-2'-sulpho-ethyl) acrylamide, and copolymers of ethylene glycol, terephthalic acid and 5-sulpho-isophthalic acid.

13. An electroluminescent device consisting of a layer configuration on a support, said layer configuration comprising a non-photoactive element exclusive of poly(3,4-alkylenedioxy-thiophene)s, poly(3,4-dialkoxythiophene)s, polyanilines and polypyrroles, said element containing at least one polymer selected from the group consisting of polysulphato-polymers and polysulpho-polymers, the surface of one side of said element being contiguous with a positive electrode and the surface on the opposite side of said element being contiguous with a material capable of transporting holes, wherein said layer configuration is an electroluminescent device.

14. Electroluminescent device according to claim 13, wherein said polysulphato-polymer is polyvinylsulphate.

15. Electroluminescent device according to claim 13, wherein said polysulpho-polymer is selected from the group consisting of: poly(styrene sulphonic acid), homo- and copolymers of 4-(2,3-dihydro-thieno[3,4-b][1,4]dioxin-2-ylmethoxy)-butane-1-sulphonic acid, polyvinylsulphonic acid, homo and copolymers of N-(1',1'-dimethyl-2'-sulpho-ethyl)acrylamide, and copolymers of ethylene glycol, terephthalic acid and 5-sulpho-isophthalic acid.

16. A light emitting diode consisting of a layer configuration on a support, said layer configuration comprising a non-photoactive element exclusive of poly(3,4-alkylenedioxythiophene)s, poly(3,4-dialkoxythiophene)s, polyanilines and polypyrroles, said element containing at least one polymer selected from the group consisting of polysulphato-polymers and polysulpho-polymers, the surface of one side of said element being contiguous with a positive electrode and the surface on the opposite side of said element being contiguous with a material capable of transporting holes according to claim 2.

17. A light emitting diode consisting of a layer configuration on a support, said layer configuration comprising a non-photoactive element exclusive of poly(3,4-alkylenedioxythiophene)s, poly(3,4-dialkoxythiophene)s, polyanilines and polypyrroles, said element containing at least one polymer selected from the group consisting of polysulphato-polymers and polysulpho-polymers, the surface of one side of said element being contiguous with a positive electrode and the surface on the opposite side of said element being contiguous with a material capable of transporting holes according to claim 3.

* * * * *